United States Patent
Chen et al.

(10) Patent No.: US 12,213,305 B2
(45) Date of Patent: Jan. 28, 2025

(54) MANUFACTURING METHOD OF SEMICONDUCTOR STRUCTURE WITH EPITAXIAL LAYER FORMING EXTENSION PORTION

(71) Applicant: CHANGXIN MEMORY TECHNOLOGIES, INC., Hefei (CN)

(72) Inventors: Longyang Chen, Hefei (CN); Zhongming Liu, Hefei (CN); Shijie Bai, Hefei (CN); Yexiao Yu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 370 days.

(21) Appl. No.: 17/455,054

(22) Filed: Nov. 16, 2021

(65) Prior Publication Data

US 2022/0336466 A1 Oct. 20, 2022

Related U.S. Application Data

(63) Continuation of application No. PCT/CN2021/111880, filed on Aug. 10, 2021.

(30) Foreign Application Priority Data

Apr. 15, 2021 (CN) .......................... 202110407971.8

(51) Int. Cl.
*H10B 12/00* (2023.01)

(52) U.S. Cl.
CPC ......... *H10B 12/482* (2023.02); *H10B 12/038* (2023.02); *H10B 12/37* (2023.02)

(58) Field of Classification Search
CPC .... H10B 12/482; H10B 12/038; H10B 12/37; H10B 12/01; H01L 21/02293; H01L 21/3147; H01L 21/20; H01L 21/76877; H01L 21/042; H01L 21/3213
See application file for complete search history.

(56) References Cited

U.S. PATENT DOCUMENTS

| | | | |
|---|---|---|---|
| 2004/0180510 A1* | 9/2004 | Ranade | H01L 29/66181 257/E21.396 |
| 2008/0087950 A1* | 4/2008 | Ueda | H10B 12/053 257/330 |
| 2013/0161710 A1* | 6/2013 | Ji | H10B 12/31 257/296 |
| 2017/0018553 A1* | 1/2017 | Lee | H10B 12/485 |
| 2018/0166450 A1* | 6/2018 | Kim | H10B 12/033 |
| 2020/0006231 A1* | 1/2020 | Song | H01L 27/0207 |
| 2021/0005621 A1* | 1/2021 | Hu | H10B 41/35 |
| 2021/0134808 A1* | 5/2021 | Kim | H10B 12/0335 |

* cited by examiner

*Primary Examiner* — Sue A Purvis
*Assistant Examiner* — Seyon Ali-Simah Punchbeddell
(74) *Attorney, Agent, or Firm* — Syncoda LLC; Feng Ma

(57) ABSTRACT

A manufacturing method of a semiconductor structure includes: providing a base; forming multiple bit line structures on the base, where the multiple bit line structures are parallel to each other and extend in a first direction, and a trench is formed between adjacent bit line structures; forming a first conductive layer in the trench, where a void is formed in the first conductive layer; removing a part of the first conductive layer to form a first groove, where the bottom of the first groove exposes the void; forming an epitaxial layer on an inner wall of the first groove; and allowing the epitaxial layer to epitaxially grow to form an extension portion, such that the extension portion fills the void.

14 Claims, 12 Drawing Sheets

MANUFACTURING METHOD OF
SEMICONDUCTOR STRUCTURE WITH
EPITAXIAL LAYER FORMING EXTENSION
PORTION

CROSS-REFERENCE TO RELATED APPLICATIONS

This is a continuation of International Application No. PCT/CN2021/111880 filed on Aug. 10, 2021, which claims priority to Chinese Patent Application No. 202110407971.8 filed on Apr. 15, 2021. The disclosures of the above-referenced applications are incorporated herein by reference in their entirety.

BACKGROUND

Dynamic random-access memory (DRAM) is a semiconductor memory that randomly writes and reads data at high speed, and is widely used in data storage devices.

A DRAM is typically composed of many repeated memory cells. Each memory cell typically includes a capacitor structure and a transistor. In the transistor, the gate is connected to a word line, the drain is connected to a bit line, and the source is connected to a capacitor structure. A conductive plug is provided on a base, and one end of the conductive plug is connected to the drain. In this way, data information stored in the capacitor structure is read through the bit line, or data information is written into the capacitor structure through the bit line.

SUMMARY

The present disclosure relates to the technical field of semiconductors, and more specifically to a manufacturing method of a semiconductor structure and a semiconductor structure.

A first aspect of embodiments of the present disclosure provides a manufacturing method of a semiconductor structure. The manufacturing method includes:

providing a base, where the base includes multiple active regions;

forming multiple spaced bit line structures on the base, where the multiple bit line structures are parallel to each other and extend in a first direction, and a trench is formed between adjacent bit line structures;

forming a first conductive layer in the trench, where a void is formed in the first conductive layer;

removing a part of the first conductive layer located in the trench, such that the remaining first conductive layer forms a conductive structure, where the conductive structure and the bit line structures enclose a first groove, and the bottom of the first groove exposes the void;

forming an epitaxial layer on an inner wall of the first groove; and allowing the epitaxial layer to epitaxially grow to form an extension portion, such that the extension portion fills the void.

A second aspect of the embodiments of the present disclosure provides a semiconductor structure. The semiconductor structure is manufactured by the above-mentioned manufacturing method of a semiconductor structure.

Figure 1:
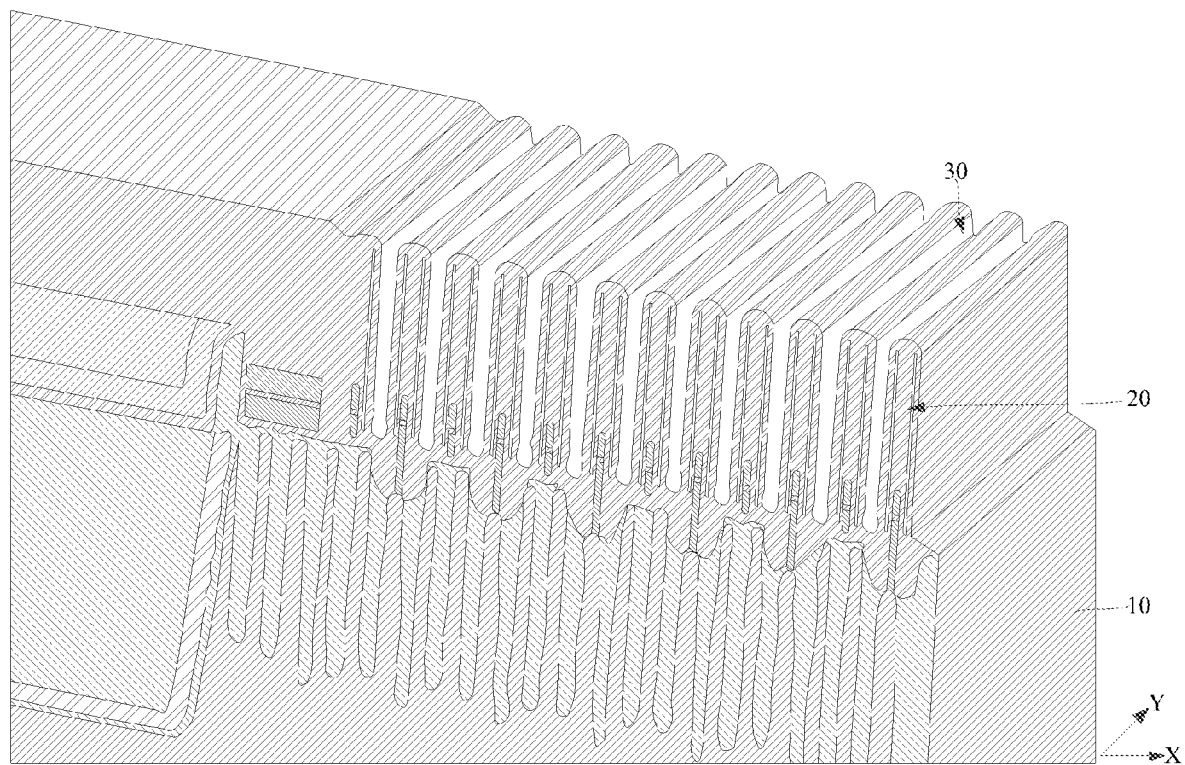
FIG. 1 is a view illustrating a structure of a bit line structure formed in some implementations.
Figure 2:
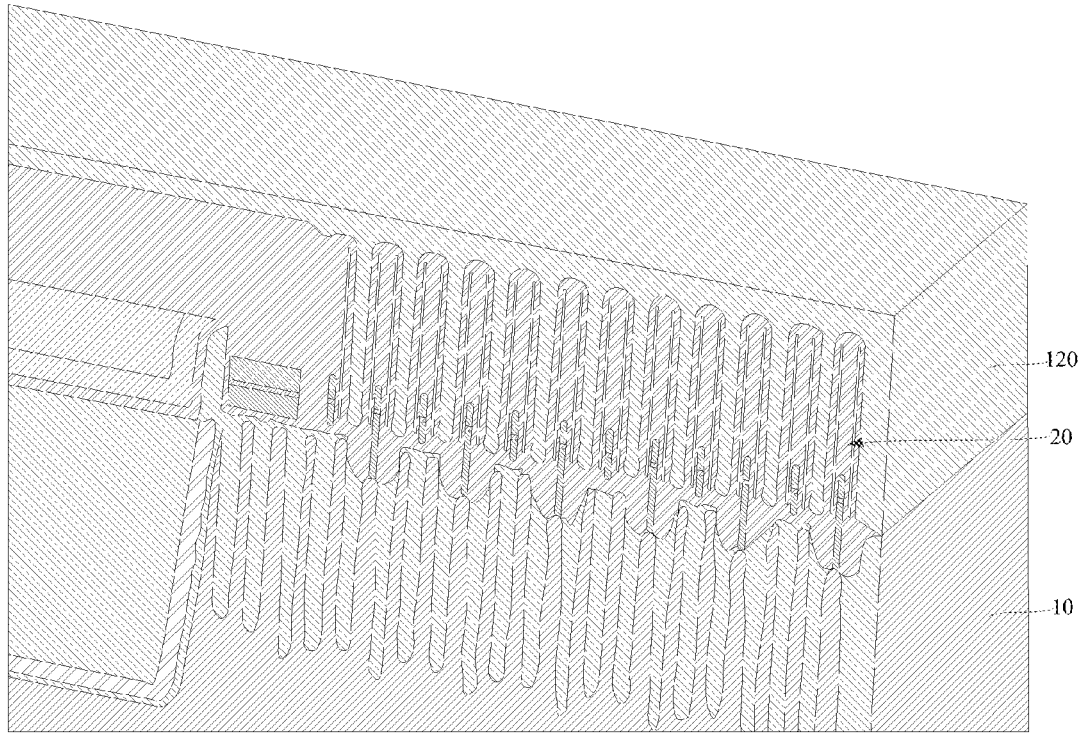
FIG. 2 is a view illustrating a structure of a sacrificial layer formed in some implementations.
Figure 3:
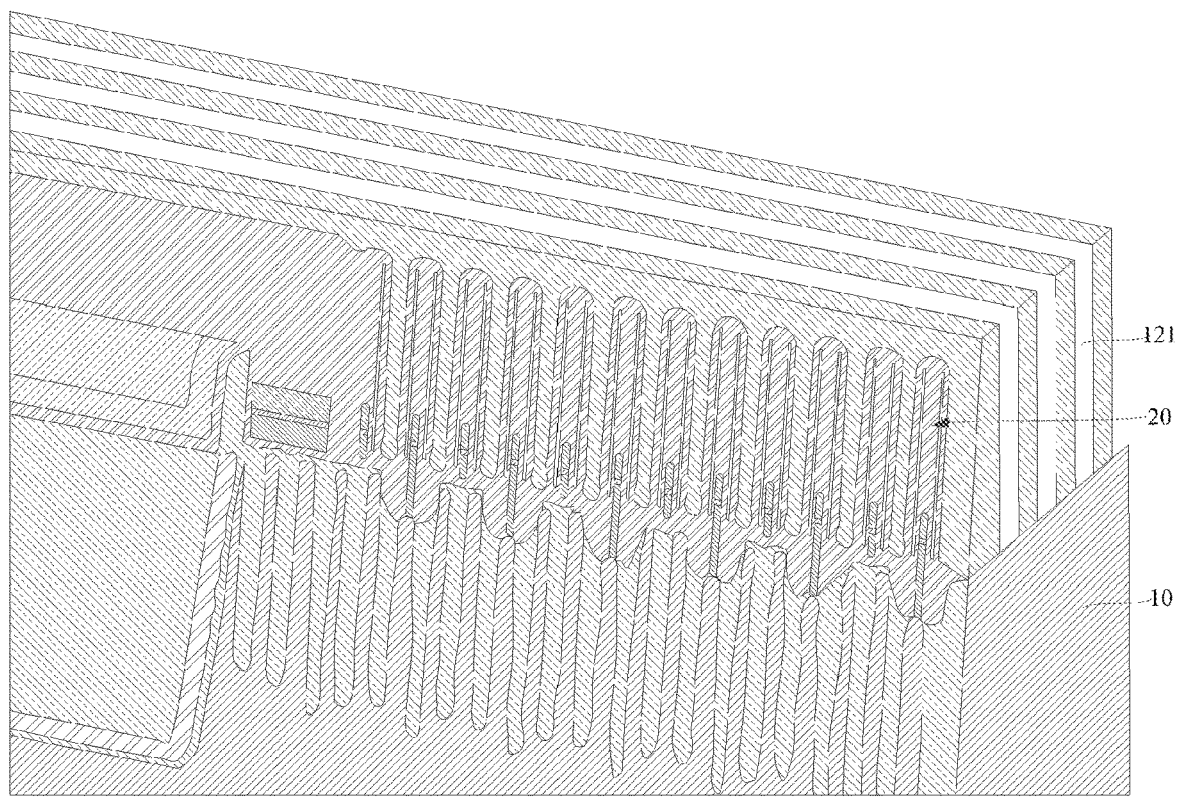
FIG. 3 is a view illustrating a structure of an etch hole formed in some implementations.
Figure 4:
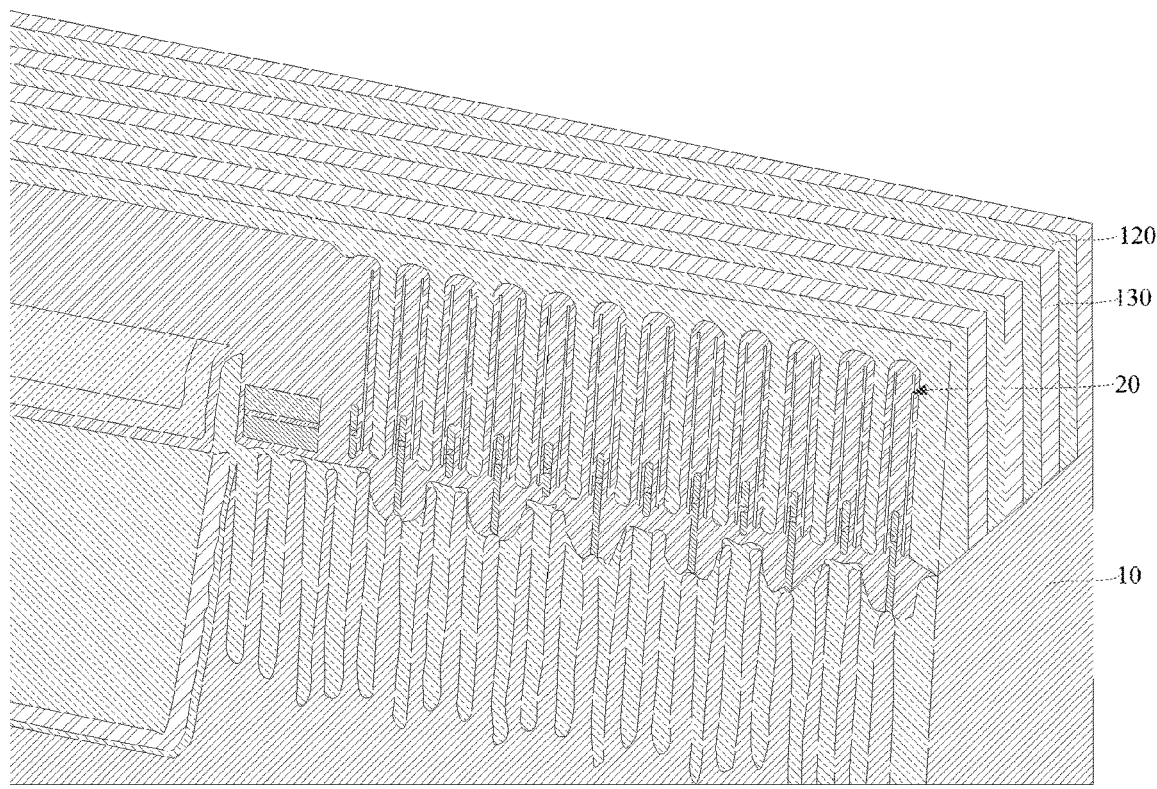
FIG. 4 is a view illustrating a structure of a silicon nitride layer formed in some implementations.
Figure 5:
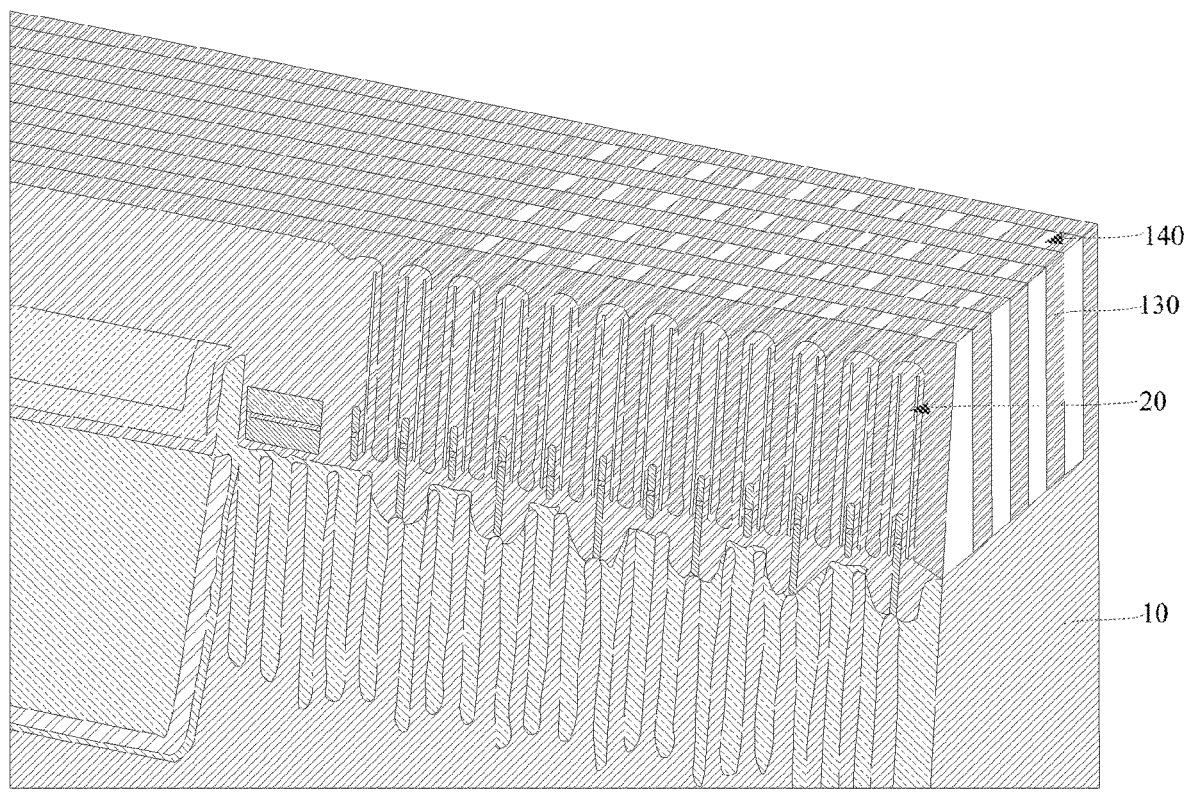
FIG. 5 is a view illustrating a structure of a contact hole formed in some implementations.

REFERENCE NUMERALS 10. base; 11. active region;
12. isolation structure; 13. accommodating recess;
20. bit line structure; 21. bit line;
211. second conductive layer; 212. barrier layer;
213. third conductive layer; 214. insulating layer;
22. intermediate trench; 23. isolation sidewall;
231. first dielectric layer; 232. second dielectric layer;
233. third dielectric layer; 30. trench;
40. first conductive layer; 41. void;
42. conductive structure; 421. conductive plug;
50. first groove; 60. epitaxial layer;
70. filling layer; 71. etch groove;
80. second groove; 90. fourth dielectric layer;
100. third groove; 110. pad;
120. sacrificial layer; 121. etch hole;
130. silicon nitride layer; 140. contact hole.

DETAILED DESCRIPTION

When a conductive plug is formed, a void is easily formed in the conductive plug, which increases the resistance of the conductive plug, thereby reducing the performance of the semiconductor structure.

As shown in FIGS. 1 to 5, when a conductive plug is formed, typically, multiple spaced bit line structures 20 are first formed on a base 10, and a sacrificial layer 120 is formed between adjacent bit line structures 20. Then, the sacrificial layer 120 is patterned to form multiple etch holes 121 that are spaced apart in the sacrificial layer 120. A length direction of the etch holes 121 is perpendicular to an extension direction of the bit line structures 20.

After the etch holes 121 are formed, a silicon nitride layer 130 is formed in the etch holes 121 by a deposition process. Then, the sacrificial layer 120 is removed, and a contact hole 140 is formed in a region where the sacrificial layer 120 is located. The silicon nitride layer on a bottom wall of the contact hole 140 is removed, such that the contact hole 140 exposes a part of an active region. Finally, the conductive plug is formed in the contact hole 140 to achieve electrical connection between the conductive plug and a drain of the active region. Since the conductive plug is formed in the contact hole 140, and the contact hole 140 has a small opening area and a large depth, a void is easily formed when the conductive plug is formed, which increases the resistance of the conductive plug and reduces the performance of the semiconductor structure.

In order to solve the above-mentioned technical problems, embodiments of the present disclosure provide a manufacturing method of a semiconductor structure and a semiconductor structure. In the present disclosure, an epitaxial layer is formed on an inner wall of a first groove, and the epitaxial layer is epitaxially grown to form an extension portion to fill a void in a conductive structure. In this way, the present disclosure improves the density of the conductive structure, thereby reducing the resistance of the conductive structure and improving the performance of the semiconductor structure.

In order to make the objectives, features and advantages of the embodiments of the present disclosure clearer, the technical solutions in the embodiments of the present disclosure are described clearly and completely below with reference to the drawings in the embodiments of the present disclosure. Apparently, the described embodiments are some rather than all of the embodiments of the present disclosure. All other embodiments obtained by those of ordinary skill in the art based on the embodiments of present disclosure without creative efforts should fall within the protection scope of the present disclosure.

Figure 6:
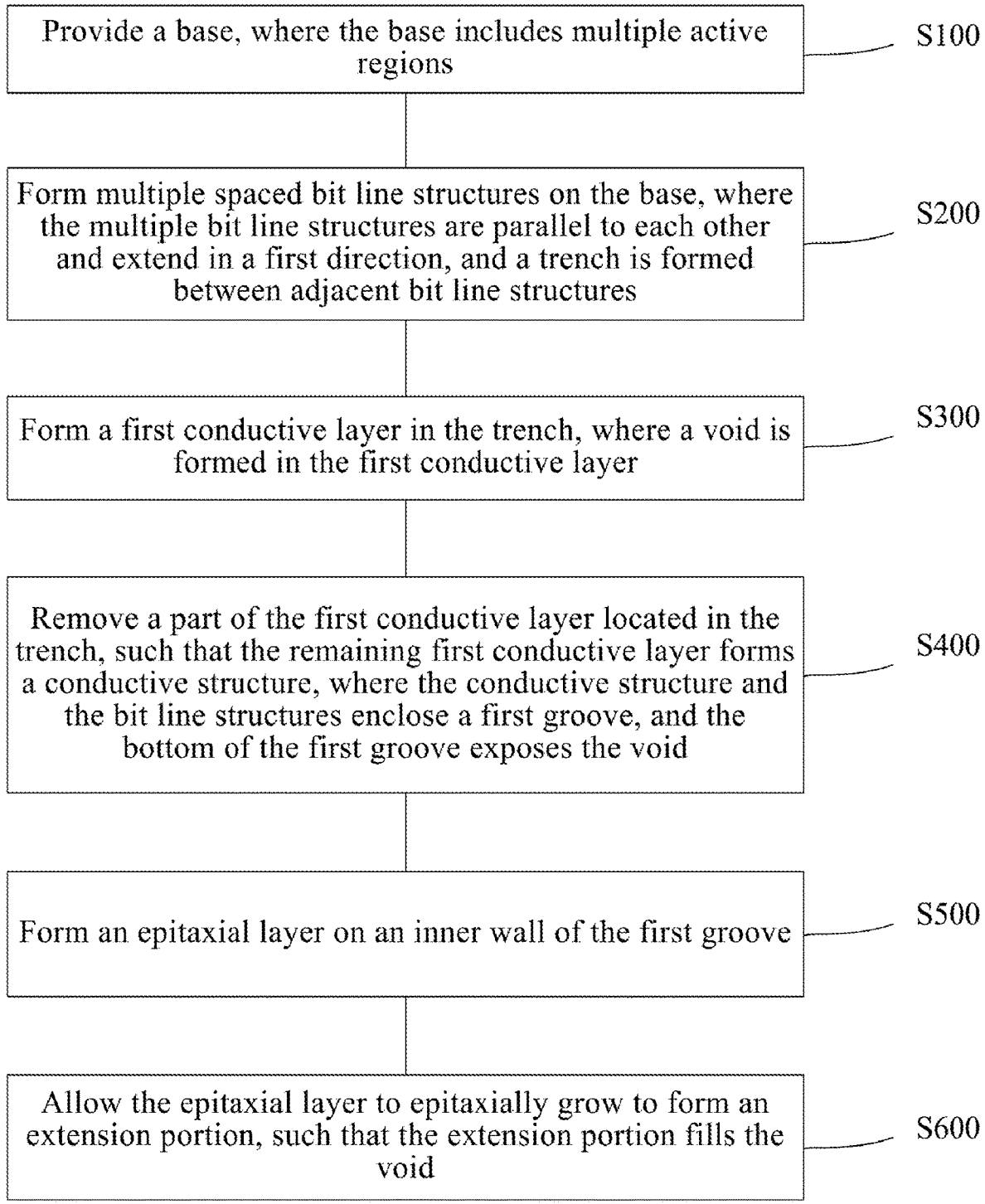
FIG. 6 is a flowchart of a manufacturing method of a semiconductor structure according to an embodiment of the present disclosure.

FIG. 6 is a flowchart of a manufacturing method of a semiconductor structure according to an embodiment of the present disclosure, and FIGS. 7 to 22 are views illustrating various steps of the manufacturing method of a semiconductor structure. The manufacturing method of a semiconductor structure is described below with reference to FIGS. 6 to 22.

Figure 7:
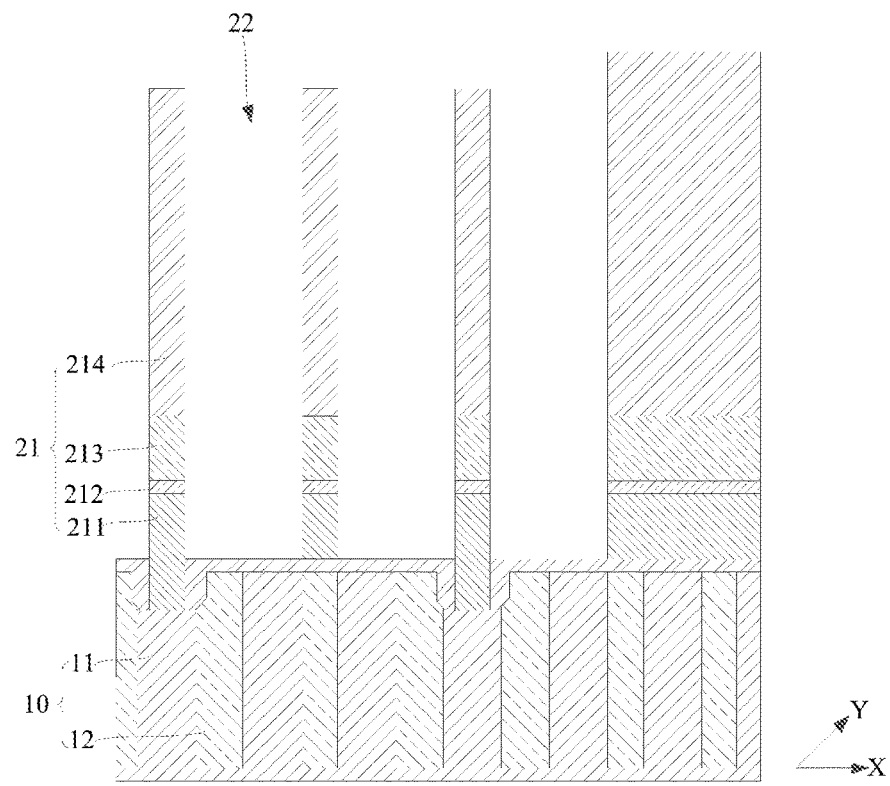
FIG. 7 is a view illustrating a structure of a bit line formed by the manufacturing method of a semiconductor structure according to an embodiment of the present disclosure.
Figure 8:
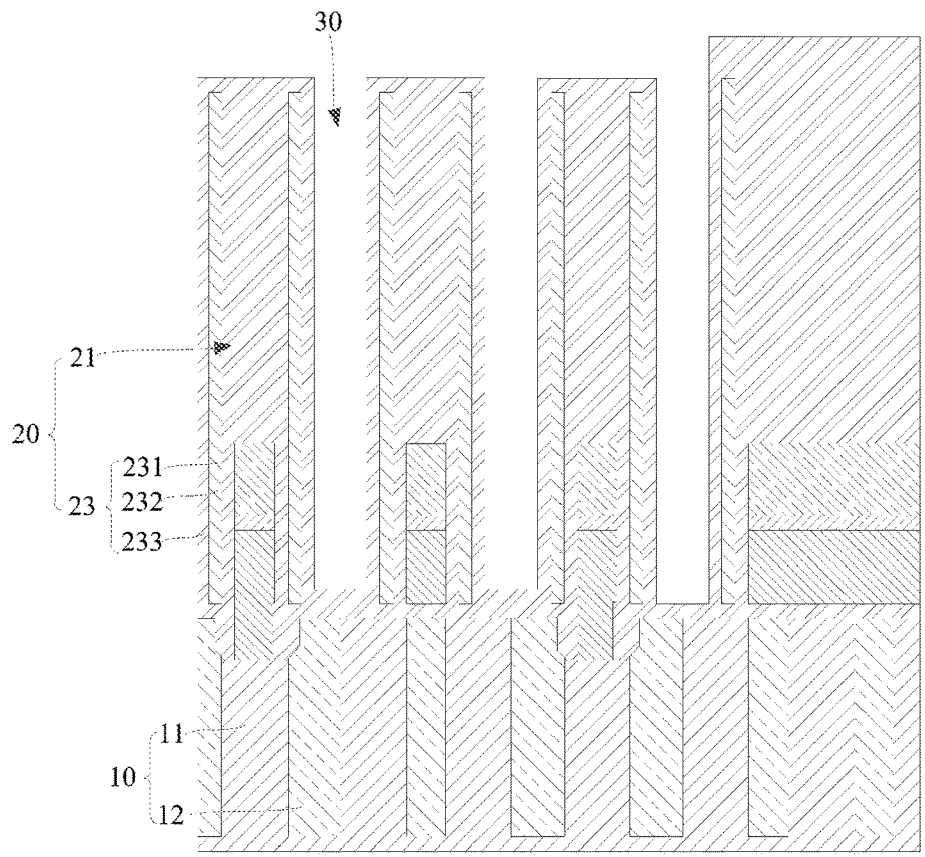
FIG. 8 is a view illustrating a structure of a bit line structure formed by the manufacturing method of a semiconductor structure according to an embodiment of the present disclosure.

S100: Provide a base, where the base includes multiple active regions. Exemplarily, as shown in FIGS. 7 and 8, the base 10 serves as a support member of a memory and is used to support other components provided thereon. The base 10 may be made of a semiconductor material. The semiconductor material may be one or more of the group consisting of silicon, germanium, silicon-germanium and silicon-carbon.

The base 10 is provided therein with multiple active regions 11 and isolation structures 12 for separating the active regions 11. When the isolation structures 12 are formed, isolation trenches may be formed in the base, and then an insulating material is deposited into the isolation trenches to form the isolation structures 12.

S200: Form multiple spaced bit line structures on the base, where multiple bit line structures are parallel to each other and extend in a first direction, and a trench is formed between adjacent bit line structures.

It should be noted that the first direction may be a Y direction shown in FIGS. 1 and 7, that is, a direction inward to the plane of the paper.

Exemplarily, referring to FIG. 7, multiple spaced bit lines 21 are formed on the base 10. An intermediate trench 22 is formed between adjacent bit lines 21. The bit lines 21 each include a second conductive layer 211, a barrier layer 212, a third conductive layer 213 and an insulating layer 214 stacked in sequence. The second conductive layer 211 is provided on the base 10.

In this embodiment, the material of the second conductive layer 211 may include a conductive material such as polysilicon. The material of the barrier layer 212 includes a conductive material such as silicon nitride. The material of the third conductive layer 213 may include a conductive material such as metal tungsten. The material of the insulating layer 214 may include an insulating material such as silicon nitride.

As shown in FIG. 8, after the bit lines 21 are formed, isolation sidewalls 23 are respectively formed on surfaces of the bit lines 21 facing the intermediate trench 22. That is, taking the orientation shown in FIG. 8 as an example, isolation sidewalls 23 are formed on left and right side surfaces of the bit lines 21. The bit lines 21 and the isolation sidewalls 23 provided on the bit lines 21 define bit line structures 20. The isolation sidewalls 23 in the same intermediate trench 22 enclose a trench 30.

It should be noted that the formation process and structure of the bit line structures in this embodiment can similar to those illustrated in FIG. 1.

In this embodiment, the isolation sidewalls 23 each may include a first dielectric layer 231, a second dielectric layer 232 and a third dielectric layer 233 stacked in sequence. The first dielectric layer 231 is in contact with a sidewall of the intermediate trench 22. The second dielectric layer 232 covers the first dielectric layer 231. The third dielectric layer 233 covers a bottom wall of the intermediate trench 22 and top surfaces of the bit lines 21, and the third dielectric layer 233 located in the same intermediate trench 22 encloses the trench 30.

Exemplarily, a silicon nitride layer may be formed on an inner wall of the intermediate trench 22 by an atomic layer deposition (ALD) process. The silicon nitride layer extends to the outside of the intermediate trench 22 and covers the top surfaces of the bit lines 21. The silicon nitride layer on the bottom wall of the intermediate trench 22 and the top surfaces of the bit lines 21 is removed by an etching solution or an etching gas, and the silicon nitride layer on the sidewall of the intermediate trench 22 is retained to form the first dielectric layer 231.

A silicon oxide layer is formed on a sidewall of the first dielectric layer 231 and the bottom wall of the intermediate trench 22 by the ALD process. The silicon oxide layer on the bottom wall of the intermediate trench 22 is removed by an etching solution or an etching gas, and the silicon oxide layer on the sidewall of the first dielectric layer 231 is retained to form the second dielectric layer 232.

A silicon nitride layer is formed on a sidewall of the second dielectric layer 232 and the bottom wall of the intermediate trench 22 by the ALD process. The silicon nitride layer extends to the outside of the intermediate trench 22 and covers the top surfaces of the bit lines 21. The silicon nitride layer defines the third dielectric layer 233, and the third dielectric layer 233 located in the same intermediate trench 22 encloses the trench 30.

Figure 9:
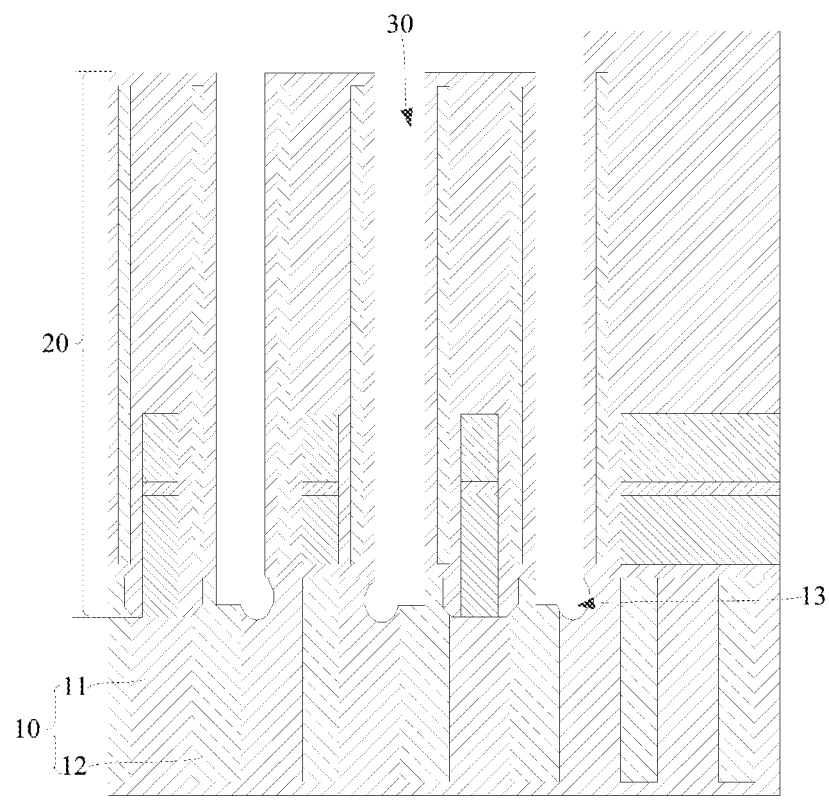
FIG. 9 is a view illustrating a structure of an accommodating recess formed by the manufacturing method of a semiconductor structure according to an embodiment of the present disclosure.

After the isolation sidewall structure is formed, as shown in FIG. 9, the manufacturing method of a semiconductor structure further includes: remove the third dielectric layer 233 on a bottom wall of the trench 30 by an etching solution or an etching gas. Thus, the active region 11 is exposed in the trench 30. After the active region 11 is exposed, a part of the active region 11 exposed in the trench 30 may be removed continuously to form an accommodating recess 13 in the active region 11.

Exemplarily, when the accommodating recess 13 is formed, a part of the active region 11 exposed in the trench 30 may be removed by dry etching. The dry etching is performed by an etching gas that is at least one of the group consisting of $SF_6$, $NF_3$ and $Cl_2$ at 5-100 mTorr and 200-1,000 W.

S300: Form a first conductive layer in the trench, such that a void is formed in the first conductive layer.

Figure 10:
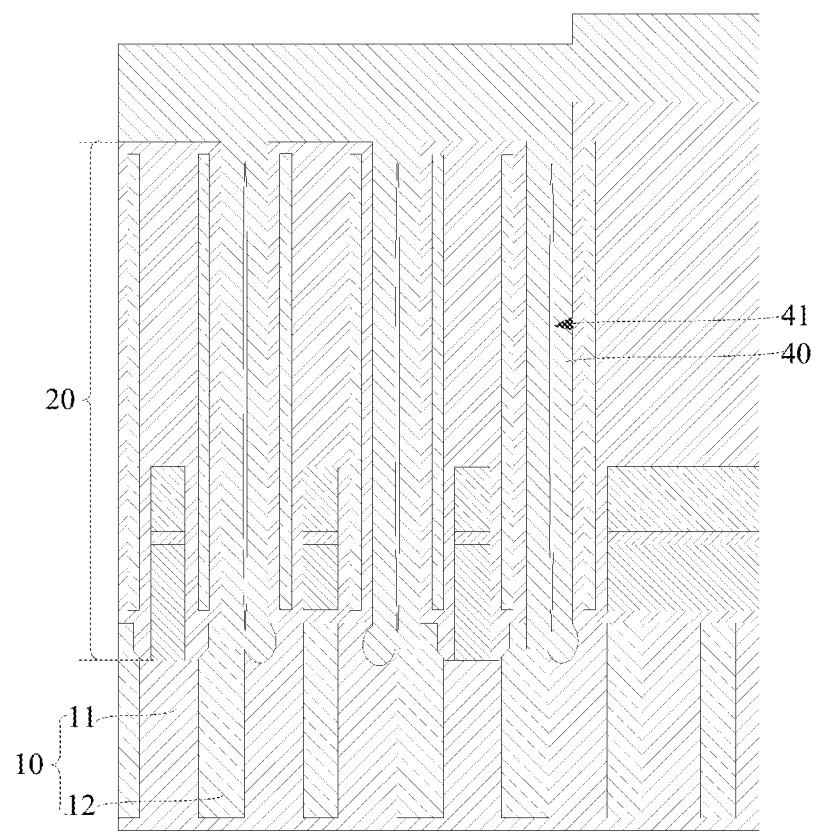
FIG. 10 is a view illustrating a first structure of a first conductive layer formed by the manufacturing method of a semiconductor structure according to an embodiment of the present disclosure.

As shown in FIG. 10, a first conductive layer 40 is formed in the trench 30 by a physical vapor deposition (PVD) process or a chemical vapor deposition (CVD) process. The first conductive layer 40 extends to the outside of the trench and covers top surfaces of the bit line structures 20. The first conductive layer 40 is filled in the accommodating recess 13. That is, an end of the first conductive layer 40 close to the base 10 is filled in the accommodating recess 13.

Generally, the trench 30 has a high aspect ratio. Therefore, in the process of depositing the first conductive layer 40, a void 41 is easily formed in the first conductive layer 40. The diameter of the void 41 is approximately 0-1.5 nm.

In this embodiment, the accommodating recess is formed in the active region. When the first conductive layer is deposited in the trench, the first conductive layer can be filled in the accommodating recess to increase the contact area between the first conductive layer and the active region, thereby increasing the conductivity between the first conductive layer and the active region.

Figure 11:
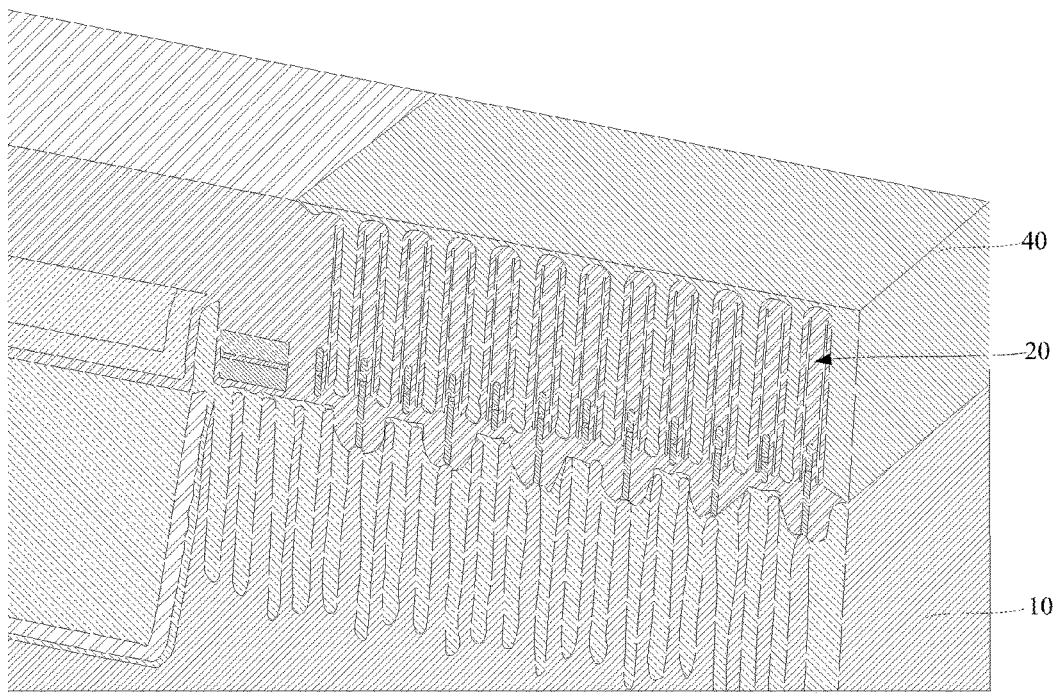
FIG. 11 is a view illustrating a second structure of the first conductive layer formed by the manufacturing method of a semiconductor structure according to an embodiment of the present disclosure.

It should be noted that, after the first conductive layer is formed, the first conductive layer may be planarized by chemical mechanical polishing (CMP), so as to planarize a top surface of the first conductive layer, as shown in FIG. 11.

S400: Remove a part of the first conductive layer located in the trench, such that the remaining first conductive layer forms a conductive structure, where the conductive structure and the bit line structures enclose a first groove, and the bottom of the first groove exposes the void.

Exemplarily, a first photoresist layer (not shown in the figure) may be formed on the first conductive layer through a coating process. The first photoresist layer is patterned by exposure, development or etching, such that the first photoresist layer forms multiple spaced first protrusions and a first opening located between adjacent first protrusions. An extension direction of the first protrusions is the same as that of the bit line structures, and the first protrusions are used to cover the bit line structures.

Figure 12:
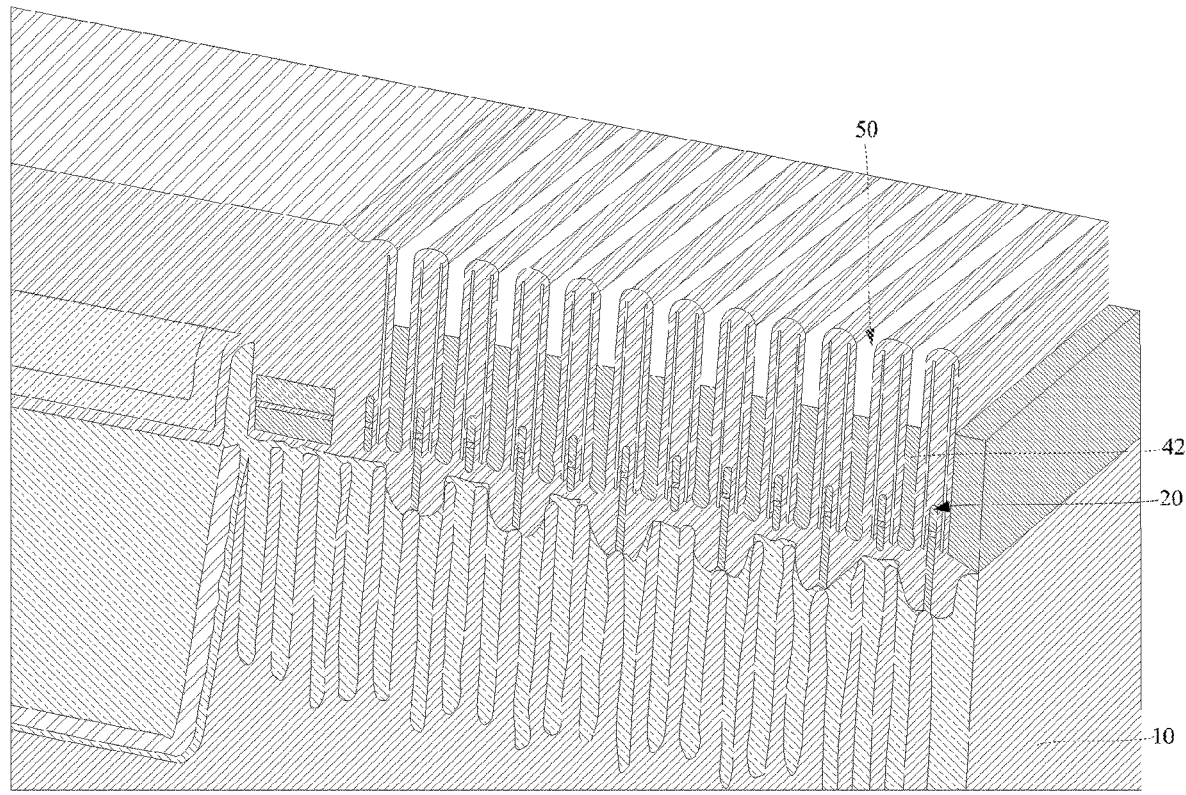
FIG. 12 is a view illustrating a first structure of a first groove and a conductive structure formed by the manufacturing method of a semiconductor structure according to an embodiment of the present disclosure.
Figure 13:
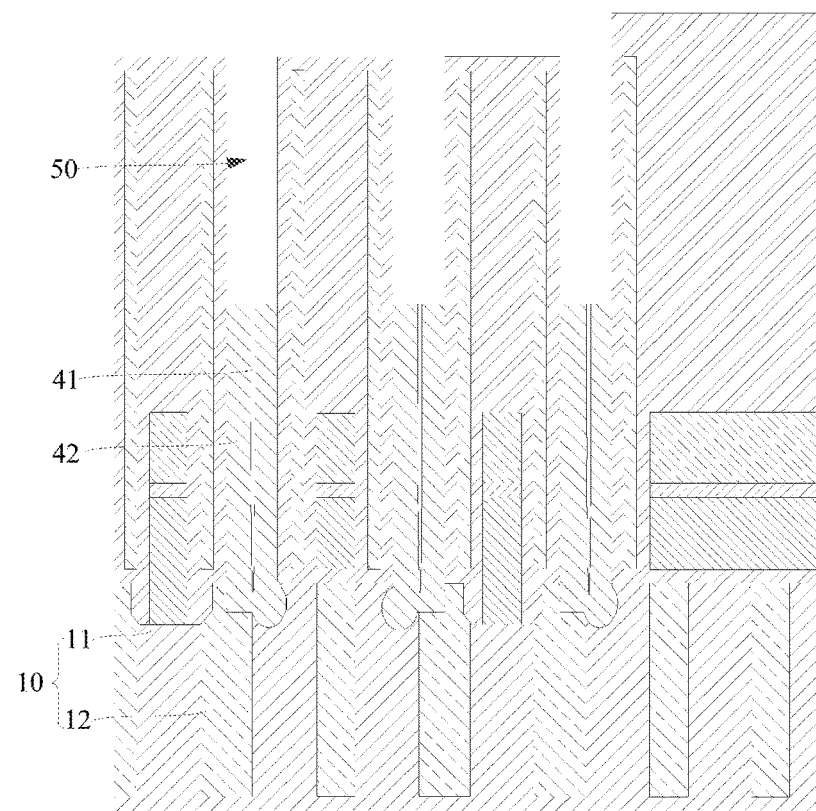
FIG. 13 is a view illustrating a second structure of the first groove and the conductive structure formed by the manufacturing method of a semiconductor structure according to an embodiment of the present disclosure.

As shown in FIGS. 12 and 13, an etching solution or an etching gas is used to remove the first conductive layer 40 exposed in the first opening 51. The removed first conductive layer 40 includes the first conductive layer 40 located on the top surfaces of the bit line structures 20 and a part of the first conductive layer 40 located in the trench 30, and the remaining first conductive layer 40 defines a conductive structure 42.

The conductive structure 42 and the bit line structures 20 enclose a first groove 50, and the void 41 is exposed at the bottom of the first groove 50. A depth ratio of the first groove 50 to the trench 30 is 1:5 to 1:3.

If the depth ratio of the first groove 50 to the trench 30 is less than 1:5, the depth of the first groove will be too small, resulting in that it is hard to expose the void and fill the void. If the depth ratio of the first groove 50 to the trench 30 is greater than 1:3, the height of the conductive structure will be reduced, thereby reducing the conductivity of the conductive structure. Therefore, in this embodiment, the depth ratio of the first groove to the trench is 1:5 to 1:3, so as to ensure the conductivity of the conductive structure and the exposition and filling of the void, thereby reducing the resistance of the conductive structure.

Figure 14:
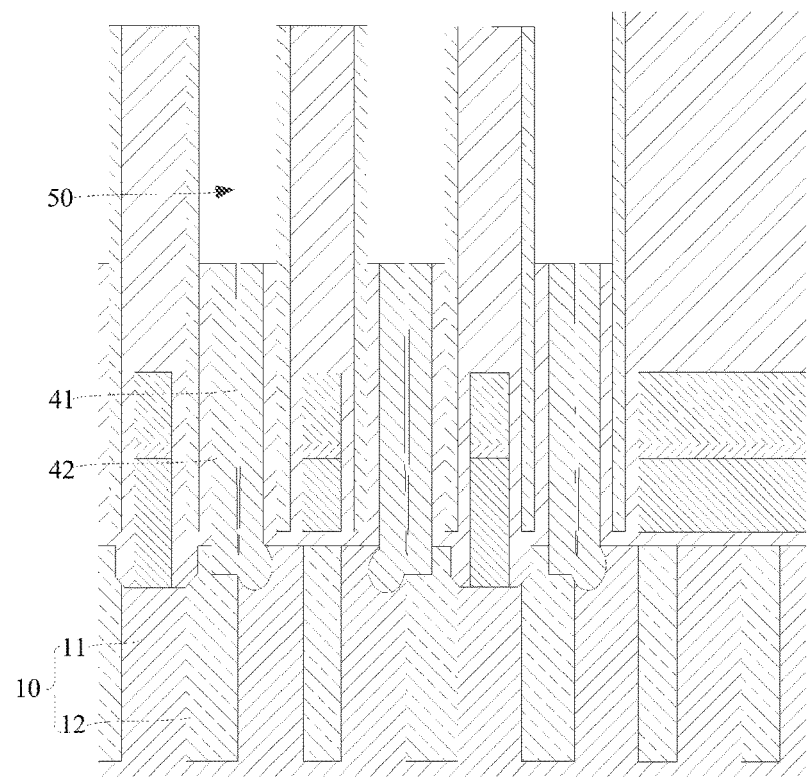
FIG. 14 is a view illustrating a structure obtained by removing a part of a third dielectric layer by the manufacturing method of a semiconductor structure according to an embodiment of the present disclosure.

As shown in FIG. 14, after the conductive structure 42 is formed, the third dielectric layer 233 on the top surfaces of the bit lines and a sidewall of the first groove 50 may be removed. A top surface of the remaining third dielectric layer 233 is flush with that of the conductive structure 42.

Exemplarily, an etching gas may be used to remove the third dielectric layer 233 located on the top surfaces of the bit lines and on the sidewall of the first groove 50. In this way, the area of the first groove 50 is increased, so as to increase the area of a pad subsequently formed in the first groove, thereby improving the performance of the semiconductor structure.

In this embodiment, the etching gas may include $CH_3F$ or $H_2$.

S500: Form an epitaxial layer on an inner wall of the first groove.

Figure 15:
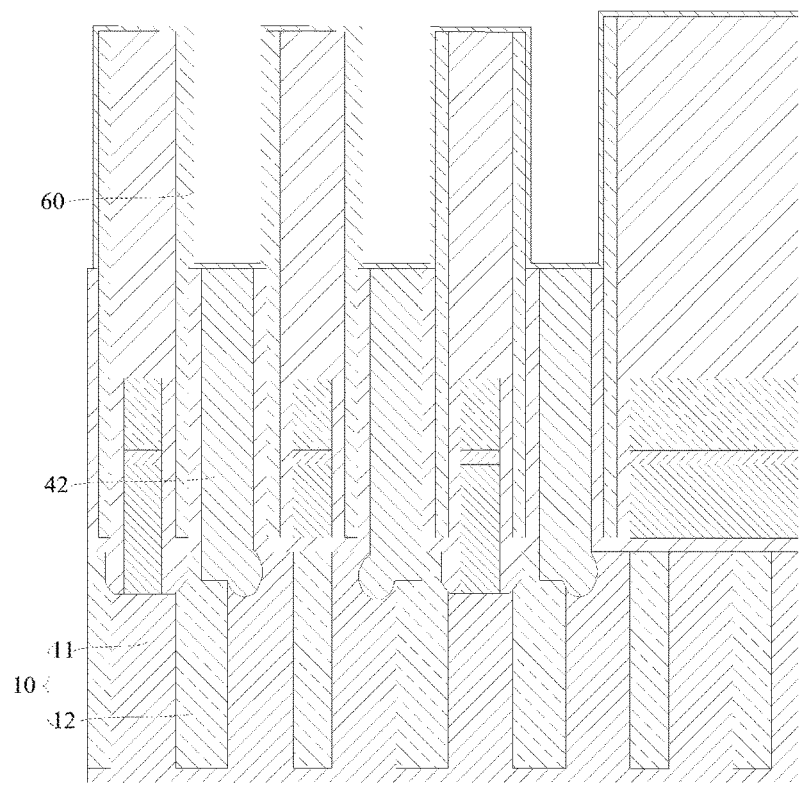
FIG. 15 is a view illustrating a structure of an epitaxial layer formed by the manufacturing method of a semiconductor structure according to an embodiment of the present disclosure.

As shown in FIG. 15, for example, an epitaxial layer 60 is formed on the inner wall of the first groove 50 by a low-pressure vapor deposition process. The epitaxial layer 60 covers the top surfaces of the bit line structures 20, that is, the epitaxial layer 60 may cover the top surfaces of the bit lines and the second dielectric layer 232. The epitaxial layer 60 and the first conductive layer 40 are made of polysilicon.

This embodiment also defines the thickness of the epitaxial layer. For example, the thickness of the epitaxial layer 60 is 1-5 nm, such that the epitaxial layer is directly oxidized to generate silicon oxide in the subsequent process of depositing a filling layer. In this way, no additional process is needed to remove the epitaxial layer, and the manufacturing process of the semiconductor structure is simplified.

It should be noted that, before the step of forming the epitaxial layer on the inner wall of the first groove, after the step of removing a part of the first conductive layer located in the trench, the manufacturing method of a semiconductor structure further includes:

Introduce chlorine gas or hydrogen gas into the first groove 50 to pre-treat a top surface of the conductive structure 42. This step is designed to remove impurities located in the first groove 50 and improve the growth interface of the epitaxial layer 60 so as to promote the growth of the epitaxial layer.

S600: Allow the epitaxial layer to epitaxially grow to form an extension portion, such that the extension fills the void.

In this embodiment, the temperature in a reaction chamber needs to be controlled to 400-600° C. so as to promote the growth of the epitaxial layer. After the temperature in the reaction chamber reaches the above range, hydrogen ($H_2$) carries a reactant gas into the reaction chamber. The reactant gas is at least one of silicon tetrachloride ($SiCl_4$), trichlorosilane ($SiHCl_3$), silane ($SiH_4$) and dichlorosilane ($SiH_2Cl_2$). The reactant gas and the epitaxial layer are reduced or thermally decomposed at high temperature to generate silicon atoms, which grow in the void to form the extension portion.

In this embodiment, the extension portion fills the void such that the conductive structure forms a dense structure, which reduces the resistance of the conductive structure, thereby improving the conductivity of the conductive structure and the performance of the semiconductor structure.

Figure 16:
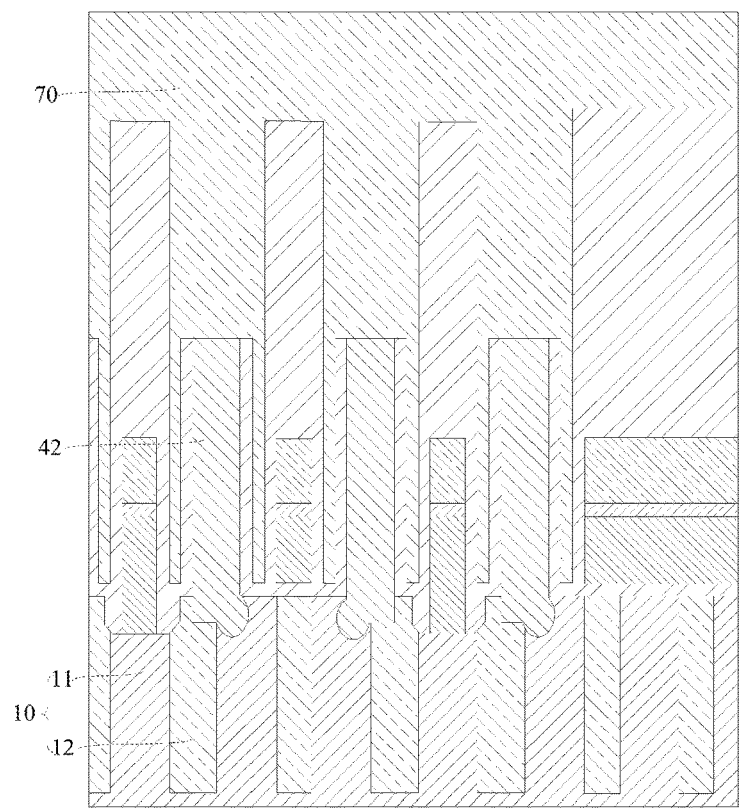
FIG. 16 is a view illustrating a first structure of a filling layer formed by the manufacturing method of a semiconductor structure according to an embodiment of the present disclosure.
Figure 17:
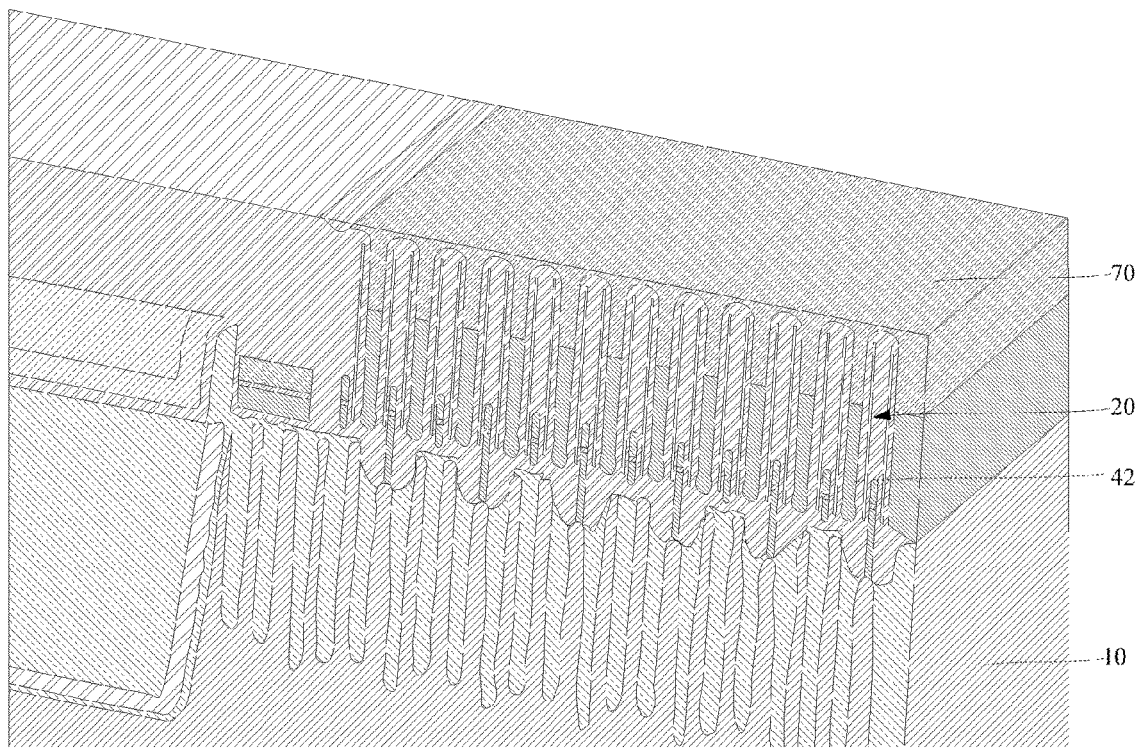
FIG. 17 is a view illustrating a second structure of the filling layer formed by the manufacturing method of a semiconductor structure according to an embodiment of the present disclosure.

After the extension portion is formed, the manufacturing method of a semiconductor structure further includes the following steps:

First, as shown in FIGS. 16 and 17, a filling layer 70 is formed in the first groove. The filling layer 70 fills the first groove 50 and covers the top surfaces of the bit line structures 20. A material of the filling layer 70 includes an insulating material such as silicon oxide. In the process of forming the filling layer, the epitaxial layer located on the sidewall of the first groove and the top surfaces of the bit line structures directly generates silicon oxide at high temperature. The silicon oxide is combined with the filling layer, such that the epitaxial layer on the sidewall of the first groove and the top surfaces of the bit line structures is removed without an additional process, which simplifies the manufacturing process of the semiconductor structure.

Figure 18:
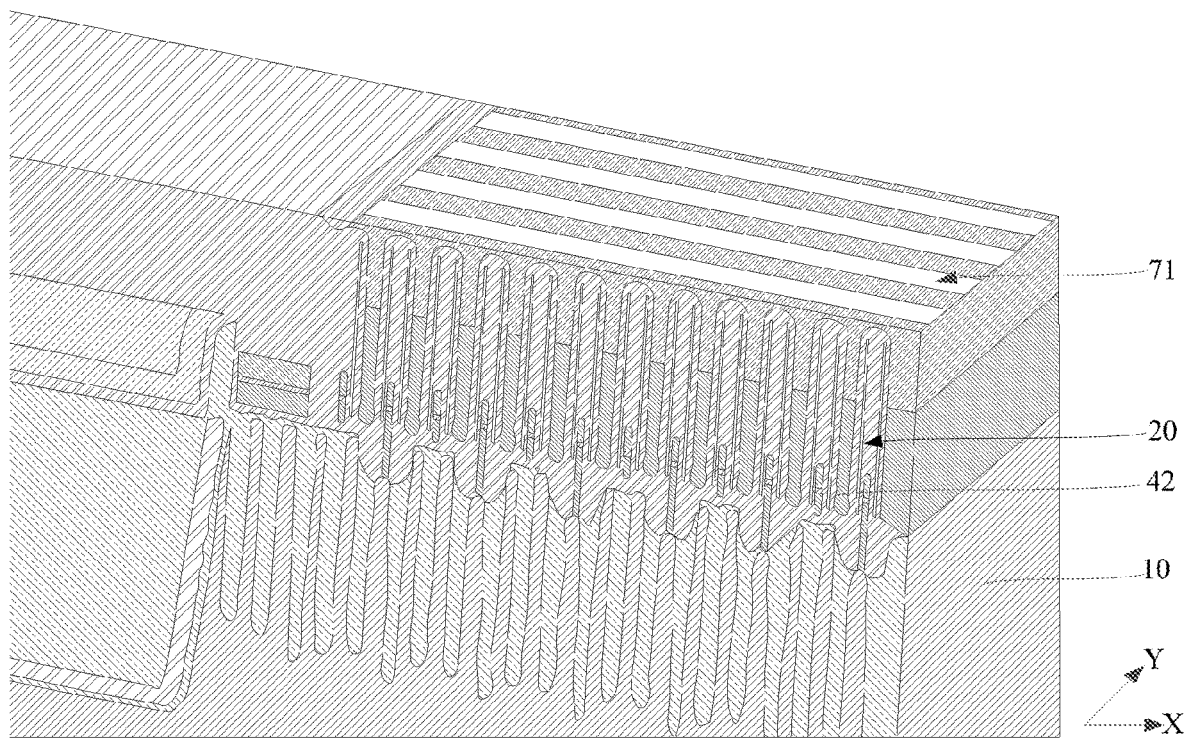
FIG. 18 is a view illustrating a structure of an etch groove formed by the manufacturing method of a semiconductor structure according to an embodiment of the present disclosure.

A second photoresist layer (not shown in the figure) is formed on the filling layer 70, and the second photoresist layer is patterned to form second openings that are spaced apart in the photoresist layer. The filling layer 70 exposed in the second openings is removed by an etching solution or an etching gas to form multiple spaced etch grooves 71 in the filling layer 70, as shown in FIG. 18. An extension direction of the etch grooves 71 is perpendicular to the first direction, that is, the length direction of the etch grooves 71 is an X direction.

Figure 19:
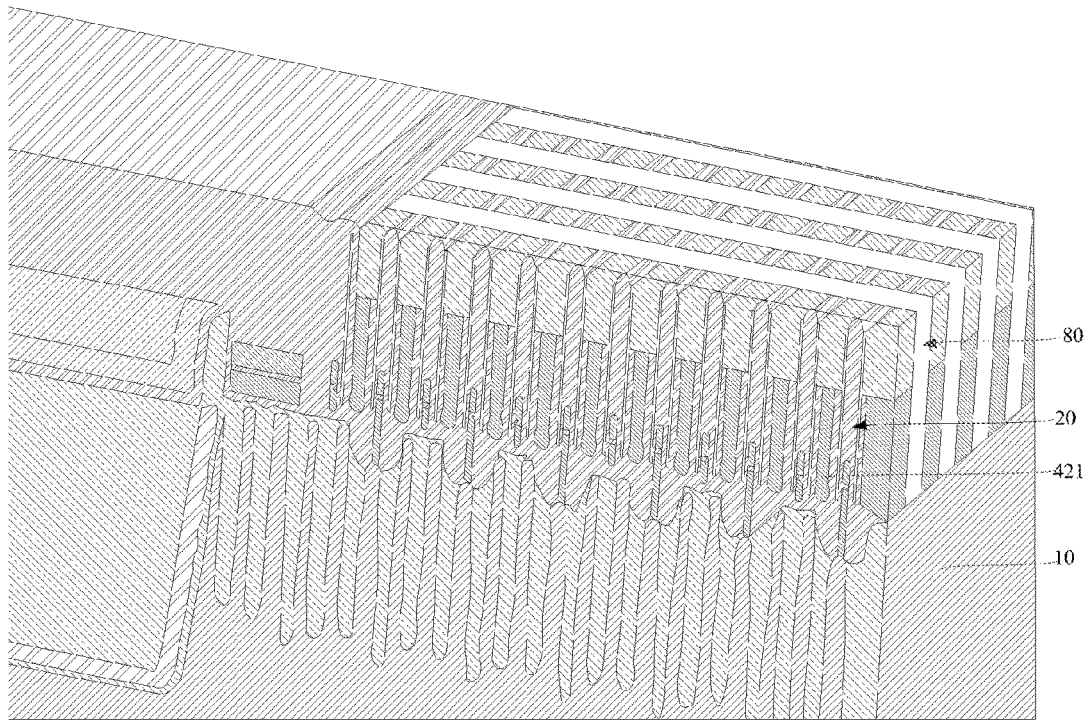
FIG. 19 is a view illustrating a structure of a second groove formed by the manufacturing method of a semiconductor structure according to an embodiment of the present disclosure.

As shown in FIG. 19, the filling layer 70 and the conductive structure 42 exposed in the etch grooves 71 are removed. The remaining conductive structure forms a conductive plug 421, and a second groove 80 is formed where the filling layer 70 and the conductive structure 42 are removed. The second groove 80 exposes the base 10.

Figure 20:
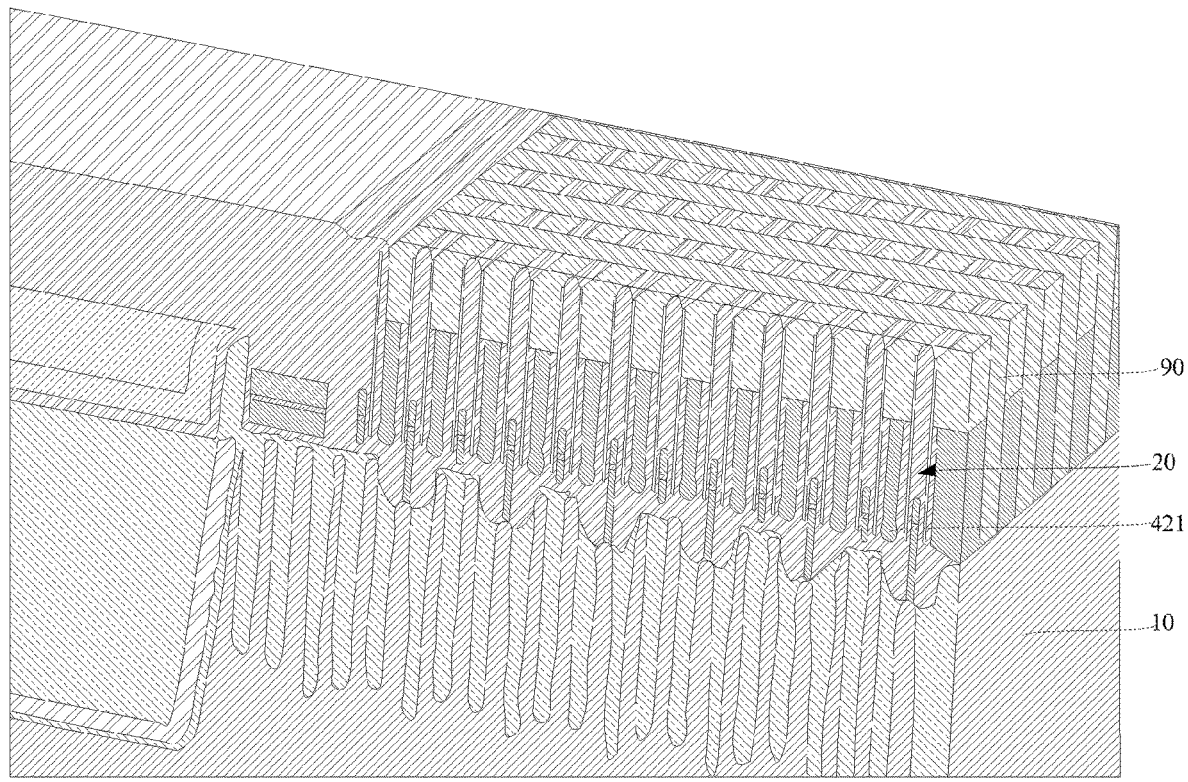
FIG. 20 is a view illustrating a structure of a fourth dielectric layer formed by the manufacturing method of a semiconductor structure according to an embodiment of the present disclosure.

As shown in FIG. 20, a fourth dielectric layer 90 is formed in the second groove 80 by a deposition process. The fourth dielectric layer 90 fills the second groove 80, and the fourth dielectric layer may include an insulating material such as silicon nitride.

Figure 21:
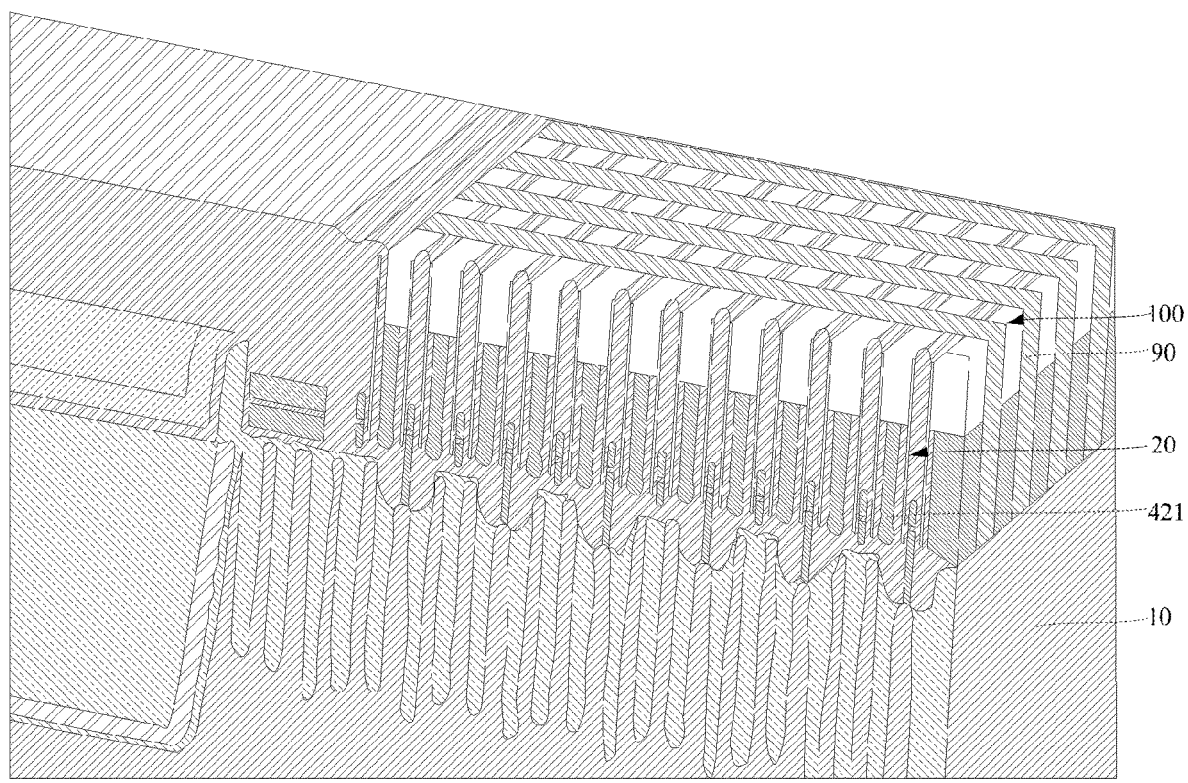
FIG. 21 is a view illustrating a structure of a third groove formed by the manufacturing method of a semiconductor structure according to an embodiment of the present disclosure.

As shown in FIG. 21, the remaining filling layer 70 is removed by a cleaning process, and the conductive plug 421 and the fourth dielectric layer 90 enclose a third groove 100.

Figure 22:
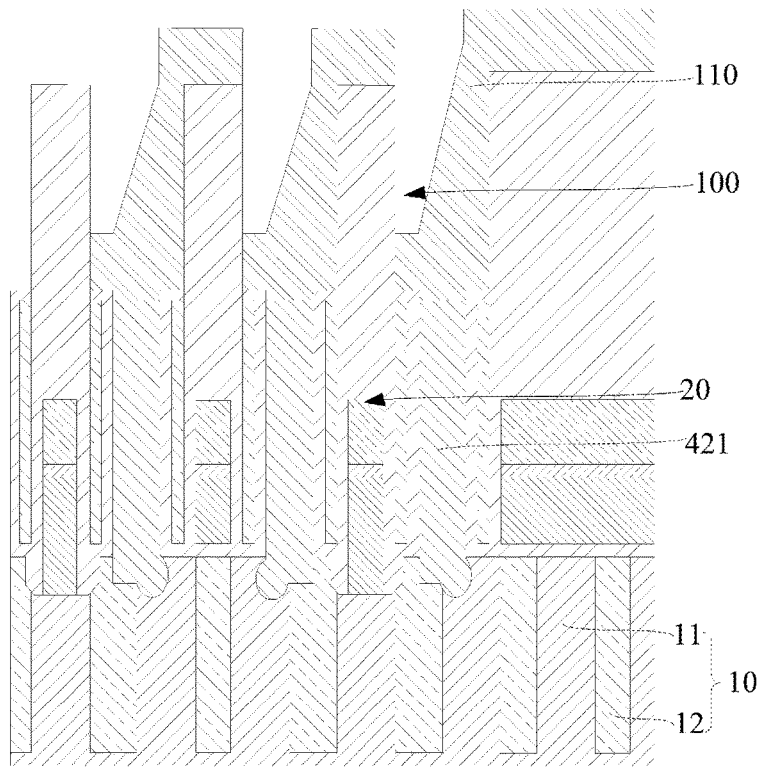
FIG. 22 is a view illustrating a structure of a pad formed by the manufacturing method of a semiconductor structure according to an embodiment of the present disclosure.

It should be noted that, after the step of removing the filling layer, the manufacturing method of a semiconductor structure further includes:

As shown in FIG. 22, a pad 110 is formed in the third groove 100. One end of the pad 110 is connected to the conductive plug 421, and the other end of the pad 110 is connected to a capacitor.

In this embodiment, the bit line structures are formed on the base, then the conductive structure is deposited in the trench formed by adjacent bit line structures, and finally multiple conductive plugs are formed by etching the conductive structure multiple times. In some implementations, a sacrificial layer is formed between bit line structures, multiple etch holes are formed at intervals in the sacrificial layer, a silicon nitride layer is filled in the etch holes, the filling layer is removed to form multiple contact holes on the base, and finally a conductive plug is formed in the contact holes. The volume of the trench in this embodiment is greater than that of the contact hole in those implementations, so it is easier to deposit the conductive structure in the trench, and the void formed in the conductive structure is less than that in the conductive plug formed in the contact hole. Subsequently, epitaxial growth is performed to fill the void, such that the formed conductive plug has no void and is denser, thereby improving the performance of the semiconductor structure. Moreover, the method of forming the conductive plug in this embodiment is simpler, which simplifies the production process of the semiconductor structure.

An embodiment of the present disclosure further provides a semiconductor structure. The semiconductor structure is manufactured by the manufacturing method provided by any one of the above embodiments.

Since the semiconductor structure provided by this embodiment is manufactured by the method provided by the above embodiments, a conductive structure of the semiconductor structure avoids the formation of a void. Therefore, the present disclosure improves the density of the conductive structure, thereby reducing the resistance of the conductive structure and improving the conductivity of the conductive structure and the performance of the semiconductor structure.

The embodiments or implementations of this specification are described in a progressive manner, and each embodiment focuses on differences from other embodiments. The same or similar parts between the embodiments may refer to each other.

In the descriptions of this specification, a description with reference to the term "one implementation", "some implementations", "an exemplary implementation", "an example", "a specific example", "some examples", or the like means that a specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

Finally, it should be noted that the above embodiments are merely used to explain the technical solutions of the present disclosure, but are not intended to limit the present disclosure. Although the present disclosure is described in detail with reference to the foregoing embodiments, those of ordinary skill in the art should understand that they can still modify the technical solutions described in the foregoing embodiments, or make equivalent substitutions on some or all technical features therein. These modifications or substitutions do not make the essence of the corresponding technical solutions deviate from the spirit and scope of the technical solutions of the embodiments of the present disclosure.

What is claimed is:

1. A manufacturing method of a semiconductor structure, comprising:
    providing a base, wherein the base comprises multiple active regions;
    forming multiple spaced bit line structures on the base, wherein the multiple bit line structures are parallel to each other and extend in a first direction, and a trench is formed between adjacent bit line structures;
    forming a first conductive layer in the trench, wherein a void is formed in the first conductive layer;
    removing a part of the first conductive layer located in the trench, such that the remaining first conductive layer forms a conductive structure, wherein the conductive structure and the bit line structures enclose a first groove, and the bottom of the first groove exposes the void;
    forming an epitaxial layer on an inner wall of the first groove; and
    allowing the epitaxial layer to epitaxially grow to form an extension portion, such that the extension portion fills the void;
    forming a filling layer in the first groove, such that the filling layer fills the first groove and covers the top surfaces of the bit line structures;
    forming multiple spaced etch grooves in the filling layer, wherein an extension direction of the etch grooves is perpendicular to the first direction;
    removing the filling layer and the conductive structure exposed in the etch grooves, such that the remaining conductive structure forms a conductive plug, and a second groove is formed where the filling layer and the conductive structure are removed, wherein the second groove exposes the base;
    forming a fourth dielectric layer in the second groove, such that the fourth dielectric layer fills the second groove; and
    removing the filling layer, such that the conductive plug and the fourth dielectric layer enclose a third groove.

2. The manufacturing method of a semiconductor structure according to claim 1, wherein the forming the epitaxial layer on the inner wall of the first groove comprises:
    forming the epitaxial layer on the inner wall of the first groove by a low-pressure vapor deposition process, wherein the epitaxial layer covers top surfaces of the bit line structures; and the epitaxial layer and the first conductive layer are made of polysilicon.

3. The manufacturing method of a semiconductor structure according to claim 2, wherein a thickness of the epitaxial layer is 1-5 nm.

4. The manufacturing method of a semiconductor structure according to claim 3, wherein the allowing the epitaxial layer to epitaxially grow comprises:
    performing the epitaxial growth at 400-600° C. by a reactant gas comprising at least one of $SiCl_4$, $SiHCl_3$, $SiH_4$, or $SiH_2Cl_2$.

5. The manufacturing method of a semiconductor structure according to claim 4, wherein prior to the forming the epitaxial layer on the inner wall of the first groove, after the removing a part of the first conductive layer located in the trench, the manufacturing method further comprises:
    introducing chlorine gas or hydrogen gas into the first groove to pre-treat a top surface of the conductive structure.

6. The manufacturing method of a semiconductor structure according to claim 1, wherein a depth ratio of the first groove to the trench is 1:5 to 1:3.

7. The manufacturing method of a semiconductor structure according to claim 1, wherein the forming multiple spaced bit line structures on the base comprises:
    forming bit lines on the base, wherein an intermediate trench is formed between adjacent bit lines;
    forming isolation sidewalls on side surfaces of the bit lines facing the intermediate trench, wherein the isolation sidewalls each comprise a first dielectric layer, a second dielectric layer and a third dielectric layer stacked in sequence; the first dielectric layer is in contact with a side surface of the intermediate trench; the third dielectric layer covers a bottom wall of the intermediate trench and top surfaces of the bit lines; and the third dielectric layer located in the same intermediate trench encloses the trench.

8. The manufacturing method of a semiconductor structure according to claim 7, wherein after the forming the isolation sidewalls on the side surfaces of the bit lines facing the intermediate trench, before the step of forming the first conductive layer in the trench, the manufacturing method further comprises:
    removing the third dielectric layer located on the bottom wall of the trench, such that the active region is exposed in the trench; and
    removing a part of the active region exposed in the trench to form an accommodating recess in the active region, wherein the first conductive layer is filled in the accommodating recess.

9. The manufacturing method of a semiconductor structure according to claim 8, wherein the removing a part of the active region exposed in the trench to form the accommodating recess in the active region comprises:
    removing a part of the active region exposed in the trench by dry etching by an etching gas comprising at least one of $SF_6$, $NF_3$ and $Cl_2$, at 5-100 mTorr and 200-1,000 W.

10. The manufacturing method of a semiconductor structure according to claim 9, wherein after the removing a part of the first conductive layer located in the trench, before the forming the epitaxial layer on the inner wall of the first groove, the manufacturing method further comprises:
    removing the third dielectric layer on the top surfaces of the bit lines and a sidewall of the first groove, such that a top surface of the remaining third dielectric layer is flush with that of the conductive structure.

11. The manufacturing method of a semiconductor structure according to claim 8, wherein the bit lines each comprise a second conductive layer, a barrier layer, a third conductive layer and an insulating layer stacked in sequence.

12. The manufacturing method of a semiconductor structure according to claim 1, wherein after the removing the filling layer, the manufacturing method further comprises:
forming a pad in the third groove, wherein one end of the pad is connected to the conductive plug, and the other end of the pad is connected to a capacitor.

13. The manufacturing method of a semiconductor structure according to claim 12, wherein a material of the filling layer comprises silicon oxide.

14. A semiconductor structure, manufactured by a manufacturing method of a semiconductor structure, the method comprising:
providing a base, wherein the base comprises multiple active regions;
forming multiple spaced bit line structures on the base, wherein the multiple bit line structures are parallel to each other and extend in a first direction, and a trench is formed between adjacent bit line structures;
forming a first conductive layer in the trench, wherein a void is formed in the first conductive layer;
removing a part of the first conductive layer located in the trench, such that the remaining first conductive layer forms a conductive structure, wherein the conductive structure and the bit line structures enclose a first groove, and the bottom of the first groove exposes the void;
forming an epitaxial layer on an inner wall of the first groove; and
allowing the epitaxial layer to epitaxially grow to form an extension portion, such that the extension portion fills the void;
forming a filling layer in the first groove, such that the filling layer fills the first groove and covers the top surfaces of the bit line structures;
forming multiple spaced etch grooves in the filling layer, wherein an extension direction of the etch grooves is perpendicular to the first direction;
removing the filling layer and the conductive structure exposed in the etch grooves, such that the remaining conductive structure forms a conductive plug, and a second groove is formed where the filling layer and the conductive structure are removed, wherein the second groove exposes the base;
forming a fourth dielectric layer in the second groove, such that the fourth dielectric layer fills the second groove; and
removing the filling layer, such that the conductive plug and the fourth dielectric layer enclose a third groove.

* * * * *